United States Patent
Jelonnek et al.

(10) Patent No.: US 9,497,701 B2
(45) Date of Patent: Nov. 15, 2016

(54) METHOD, APPARATUS AND COMPUTER PROGRAM

(71) Applicant: Nokia Solutions and Networks Oy, Espoo (FI)

(72) Inventors: Bjoern Jelonnek, Ulm (DE); Andree Haubrich, Blaubeuren (DE); Michael Weber, Neu-Ulm (DE)

(73) Assignee: Nokia Solutions and Networks Oy, Espoo (FI)

( * ) Notice: Subject to any disclaimer, the term of this patent is extended or adjusted under 35 U.S.C. 154(b) by 0 days.

(21) Appl. No.: 14/753,100

(22) Filed: Jun. 29, 2015

(65) Prior Publication Data
US 2016/0073337 A1 Mar. 10, 2016

(30) Foreign Application Priority Data
Sep. 10, 2014 (EP) .................................... 14184253

(51) Int. Cl.
*H04W 52/02* (2009.01)
*H04B 1/04* (2006.01)
*H04W 24/08* (2009.01)
*H04W 76/04* (2009.01)

(52) U.S. Cl.
CPC ........... *H04W 52/02* (2013.01); *H04B 1/0475* (2013.01); *H04W 24/08* (2013.01); *H04W 52/0216* (2013.01); H04B 2001/0408 (2013.01); H04W 52/028 (2013.01); H04W 76/048 (2013.01)

(58) Field of Classification Search
CPC .. H04W 52/02; H04W 24/08; H04B 1/0475; H04B 2001/0408
USPC .................. 455/522, 91, 114.3, 127.1, 127.5
See application file for complete search history.

(56) References Cited

U.S. PATENT DOCUMENTS

| | | | | |
|---|---|---|---|---|
| 7,197,325 | B2* | 3/2007 | Kim ..................... | H03G 3/3042 455/114.3 |
| 2006/0244631 | A1* | 11/2006 | Zigdon .................. | H04B 1/707 340/870.11 |
| 2009/0257527 | A1* | 10/2009 | Kluge ...................... | H03F 3/19 375/300 |
| 2014/0132354 | A1* | 5/2014 | Briffa ...................... | H03F 1/025 330/297 |
| 2014/0135050 | A1* | 5/2014 | Goedken ............... | H04W 72/04 455/509 |

FOREIGN PATENT DOCUMENTS

| | | |
|---|---|---|
| EP | 2713645 A1 | 4/2014 |
| KP | 2010/0013764 A | 2/2010 |
| WO | WO-2011/147450 A1 | 12/2011 |

* cited by examiner

*Primary Examiner* — Tuan Pham
(74) *Attorney, Agent, or Firm* — Harrington & Smith

(57) ABSTRACT

A method including determining whether a transmitter of an apparatus has information to transmit; and causing a power amplifier of said apparatus to enter a first power state in response to said determining; wherein said determining is carried out within a radio portion of said apparatus.

19 Claims, 5 Drawing Sheets

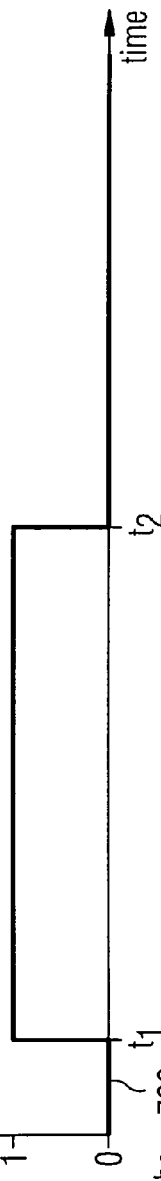
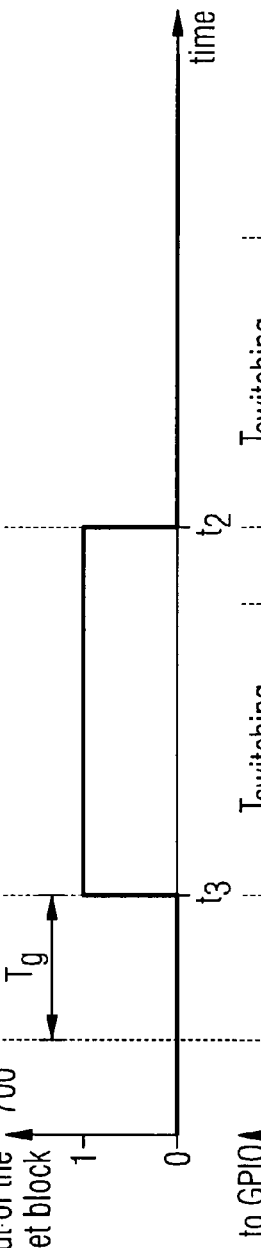
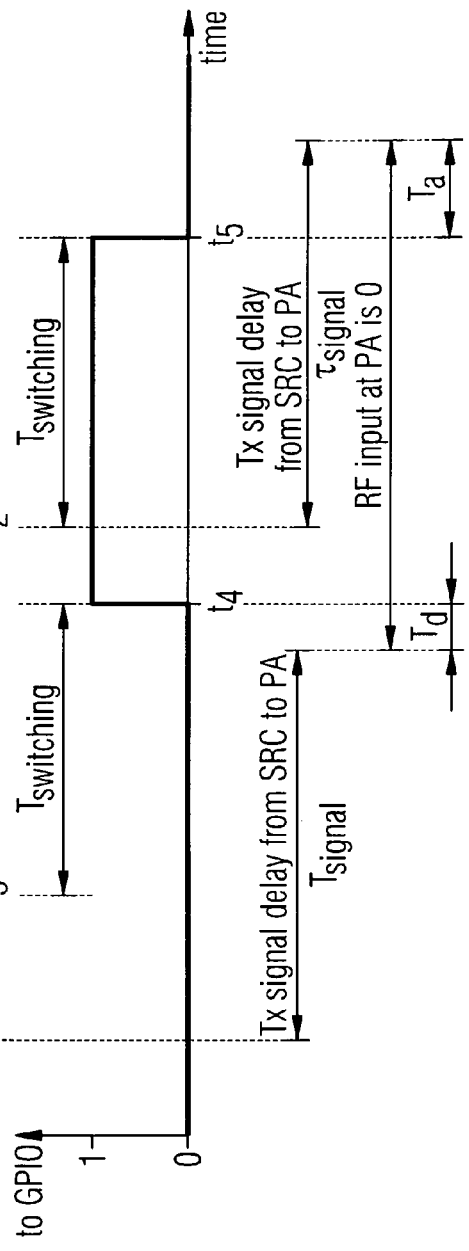
FIG 7A  zero detection for the pipe-input to the counter/reset block
FIG 7B  output of the counter/reset block
FIG 7C  to GPIO

METHOD, APPARATUS AND COMPUTER PROGRAM

The present invention relates to methods, apparatus and computer programs for power control in an apparatus.

BACKGROUND

A communication system can be seen as a facility that enables communication sessions between two or more entities such as fixed or mobile communication devices, base stations, servers and/or other communication nodes. A communication system and compatible communicating entities typically operate in accordance with a given standard or specification which sets out what the various entities associated with the system are permitted to do and how that should be achieved. For example, the standards, specifications and related protocols can define the manner how various aspects of communication shall be implemented between communicating devices. A communication can be carried on wired or wireless carriers. In a wireless communication system at least a part of communications between stations occurs over a wireless link.

Examples of wireless systems include public land mobile networks (PLMN) such as cellular networks, satellite based communication systems and different wireless local networks, for example wireless local area networks (WLAN). A wireless system can be divided into cells or other radio coverage or service areas. A radio service area is provided by a station. Radio service areas can overlap, and thus a communication device in an area can typically send signals to and receive signals from more than one station.

A user can access the communication system by means of an appropriate communication device. A communication device of a user is often referred to as user equipment (UE) or terminal. A communication device is provided with an appropriate signal receiving and transmitting arrangement for enabling communications with other parties. Typically a communication device is used for enabling receiving and transmission of communications such as speech and data. In wireless systems a communication device provides a transceiver station that can communicate with another communication device such as e.g. a base station and/or another user equipment. The communication device may access a carrier provided by a station, for example a base station, and transmit and/or receive communications on the carrier.

SUMMARY

According to a first aspect there is provided a method comprising: determining whether a transmitter of an apparatus has information to transmit; and causing a power amplifier of said apparatus to enter a first power state in response to said determining; wherein said determining is carried out within a radio portion of said apparatus.

In some embodiments, said determining whether the transmitter has information to transmit comprises determining that said transmitter has no information to transmit.

In some embodiments, said determining whether the transmitter has information to transmit comprises determining a transmit power of the transmitter.

In some embodiments, the method comprises determining a threshold transmit power level.

In some embodiments, the determining whether the transmitter has information to transmit comprises determining whether a transmit power level is below the threshold transmit power level.

In some embodiments, the method is carried out during a signal-break period.

In some embodiments, said first state of said power amplifier comprises a low power state.

In some embodiments, the low power state comprises a zero-power state.

In some embodiments, the method comprises switching off the power amplifier in the low power state.

In some embodiments, the method comprises causing said power amplifier to enter a second power state.

In some embodiments, said second power state is a higher power state than the first power state.

In some embodiments, the higher power state comprises a power above zero-power.

In some embodiments, the method comprises causing the power amplifier to enter the second power state when it is determined that there is a threshold amount of information to transmit.

In some embodiments, the method comprises operating a counter to monitor a time period of said determining whether the transmitter has information to transmit In some embodiments, the method comprises resetting said counter when it is determined that there is information to transmit.

In some embodiments, the method comprises configuring a delay between said determining whether the transmitter has information to transmit and said causing the power amplifier of said apparatus to enter the first power state.

In some embodiments, said causing the power amplifier of said apparatus to enter the first power state is in direct response to said determining whether the transmitter has information to transmit.

In some embodiments, the apparatus further comprises a system portion.

In some embodiments, said determining whether the transmitter has information to transmit is carried out independently of said system portion.

In some embodiments, said causing a power amplifier of said apparatus to enter a first power state in response to said determining is carried out independently of said system portion.

In some embodiments, a digital pre-distortion unit of said apparatus receives information regarding the state of the power amplifier, to optimise operation of the power amplifier.

In some embodiments, said apparatus is comprised in one of: a base station; a network node; a user equipment.

In some embodiments, the radio portion comprises a Radio Frequency block of the apparatus.

In some embodiments, the power amplifier is comprised in the radio portion.

In a second aspect there is provided a computer program comprising computer executable instructions which when run on one or more processors perform the method of the first aspect.

In a third aspect there is provided an apparatus comprising: at least one processor; and at least one memory including computer program code; the at least one memory and the computer program code configured to, with the at least one processor, cause the apparatus at least to: determine whether a transmitter of said apparatus has information to transmit; and cause a power amplifier of said apparatus to enter a first power state in response to said determining; wherein said determining is carried out within a radio portion of said apparatus.

In some embodiments, said determining whether the transmitter has information to transmit comprises determining that said transmitter has no information to transmit.

In some embodiments, said determining whether the transmitter has information to transmit comprises determining a transmit power of the transmitter.

In some embodiments, the apparatus is configured to determine a threshold transmit power level.

In some embodiments, the determining whether the transmitter has information to transmit comprises determining whether a transmit power level is below the threshold transmit power level.

In some embodiments, the apparatus is configured to carry out the determining during a signal-break period.

In some embodiments, said first state of said power amplifier comprises a low power state.

In some embodiments, the low power state comprises a zero-power state.

In some embodiments, the apparatus is configured to switch off the power amplifier in the low power state.

In some embodiments, the apparatus is configured to cause said power amplifier to enter a second power state.

In some embodiments, said second power state is a higher power state than the first power state.

In some embodiments, the higher power state comprises a power above zero-power.

In some embodiments, the apparatus is configured to cause the power amplifier to enter the second power state when it is determined that there is a threshold amount of information to transmit.

In some embodiments, the apparatus comprises a counter, and the apparatus is configured to operate the counter to monitor a time period of said determining whether the transmitter has information to transmit In some embodiments, the apparatus is configured to reset said counter when it is determined that there is information to transmit.

In some embodiments, the apparatus is configured to configure a delay between said determining whether the transmitter has information to transmit and said causing the power amplifier of said apparatus to enter the first power state.

In some embodiments, said causing the power amplifier of said apparatus to enter the first power state is in direct response to said determining whether the transmitter has information to transmit.

In some embodiments, the apparatus further comprises a system portion.

In some embodiments, said determining whether the transmitter has information to transmit is carried out independently of said system portion.

In some embodiments, said causing a power amplifier of said apparatus to enter a first power state in response to said determining is carried out independently of said system portion.

In some embodiments, the apparatus further comprises a digital pre-distortion unit configured to receive information regarding the state of the power amplifier, to optimise operation of the power amplifier.

In some embodiments, said apparatus comprises one of: a base station; a network node; a user equipment.

In some embodiments, the radio portion comprises a Radio Frequency block of the apparatus.

In some embodiments, the power amplifier is comprised in the radio portion.

In a further aspect there is provided an apparatus comprising: means for determining whether a transmitter of said apparatus has information to transmit; and means for causing a power amplifier of said apparatus to enter a first power state in response to said determining; wherein said determining is carried out within a radio portion of said apparatus.

In some embodiments, said determining whether the transmitter has information to transmit comprises determining that said transmitter has no information to transmit.

In some embodiments, said determining whether the transmitter has information to transmit comprises determining a transmit power of the transmitter.

In some embodiments, the apparatus comprises means for determining a threshold transmit power level.

In some embodiments, the determining whether the transmitter has information to transmit comprises determining whether a transmit power level is below the threshold transmit power level.

In some embodiments, the apparatus is configured to carry out the determining during a signal-break period.

In some embodiments, said first state of said power amplifier comprises a low power state.

In some embodiments, the low power state comprises a zero-power state.

In some embodiments, the apparatus comprises means for switching off the power amplifier in the low power state.

In some embodiments, the apparatus comprises means for causing said power amplifier to enter a second power state.

In some embodiments, said second power state is a higher power state than the first power state.

In some embodiments, the higher power state comprises a power above zero-power.

In some embodiments, the apparatus comprises means for causing the power amplifier to enter the second power state when it is determined that there is a threshold amount of information to transmit.

In some embodiments, the apparatus comprises counting means, the apparatus configured to operate the counting means to monitor a time period of said determining whether the transmitter has information to transmit.

In some embodiments, the apparatus is configured to reset said counter when it is determined that there is information to transmit.

In some embodiments, the apparatus comprises means for configuring a delay between said determining whether the transmitter has information to transmit and said causing the power amplifier of said apparatus to enter the first power state.

In some embodiments, said causing the power amplifier of said apparatus to enter the first power state is in direct response to said determining whether the transmitter has information to transmit.

In some embodiments, the apparatus further comprises a system portion.

In some embodiments, said determining whether the transmitter has information to transmit is carried out independently of said system portion.

In some embodiments, said causing a power amplifier of said apparatus to enter a first power state in response to said determining is carried out independently of said system portion.

In some embodiments, the apparatus further comprises a digital pre-distortion unit configured to receive information regarding the state of the power amplifier, to optimise operation of the power amplifier.

In some embodiments, said apparatus comprises one of: a base station; a network node; a user equipment.

In some embodiments, the radio portion comprises a Radio Frequency block of the apparatus.

In some embodiments, the power amplifier is comprised in the radio portion.

BRIEF DESCRIPTION OF DRAWINGS

Some embodiments will now be explained with reference to the appended Figures in which:

FIGS. 7a to 7c show signal profiles according to an embodiment.

DESCRIPTION OF SOME EMBODIMENTS

In the following certain exemplifying embodiments are explained with reference to a wireless or mobile communication system serving mobile communication devices. Before explaining in detail the exemplifying embodiments, certain general principles of a wireless communication system and mobile communication devices are briefly explained with reference to FIGS. 1 to 3 to assist in understanding the technology underlying the described examples.

In a wireless communication system mobile communication devices or user equipments (UE) 102, 103, 105 are provided wireless access via at least one base station or similar wireless transmitting and/or receiving node or point. In the FIG. 1 example, two overlapping access systems or radio service areas of a cellular system 100 and 110 and three smaller radio service areas 115, 117 and 119 provided by base stations 106, 107, 116, 118 and 120 are shown. Each mobile communication device and station may have one or more radio channels open at the same time and may send signals to and/or receive signals from more than one source. It is noted that the radio service area borders or edges are schematically shown for illustration purposes only in FIG. 1. It shall also be understood that the sizes and shapes of radio service areas may vary considerably from the shapes of FIG. 1. A base station site can provide one or more cells. A base station can also provide a plurality of sectors, for example three radio sectors, each sector providing a cell or a subarea of a cell. All sectors within a cell can be served by the same base station.

Figure 1:
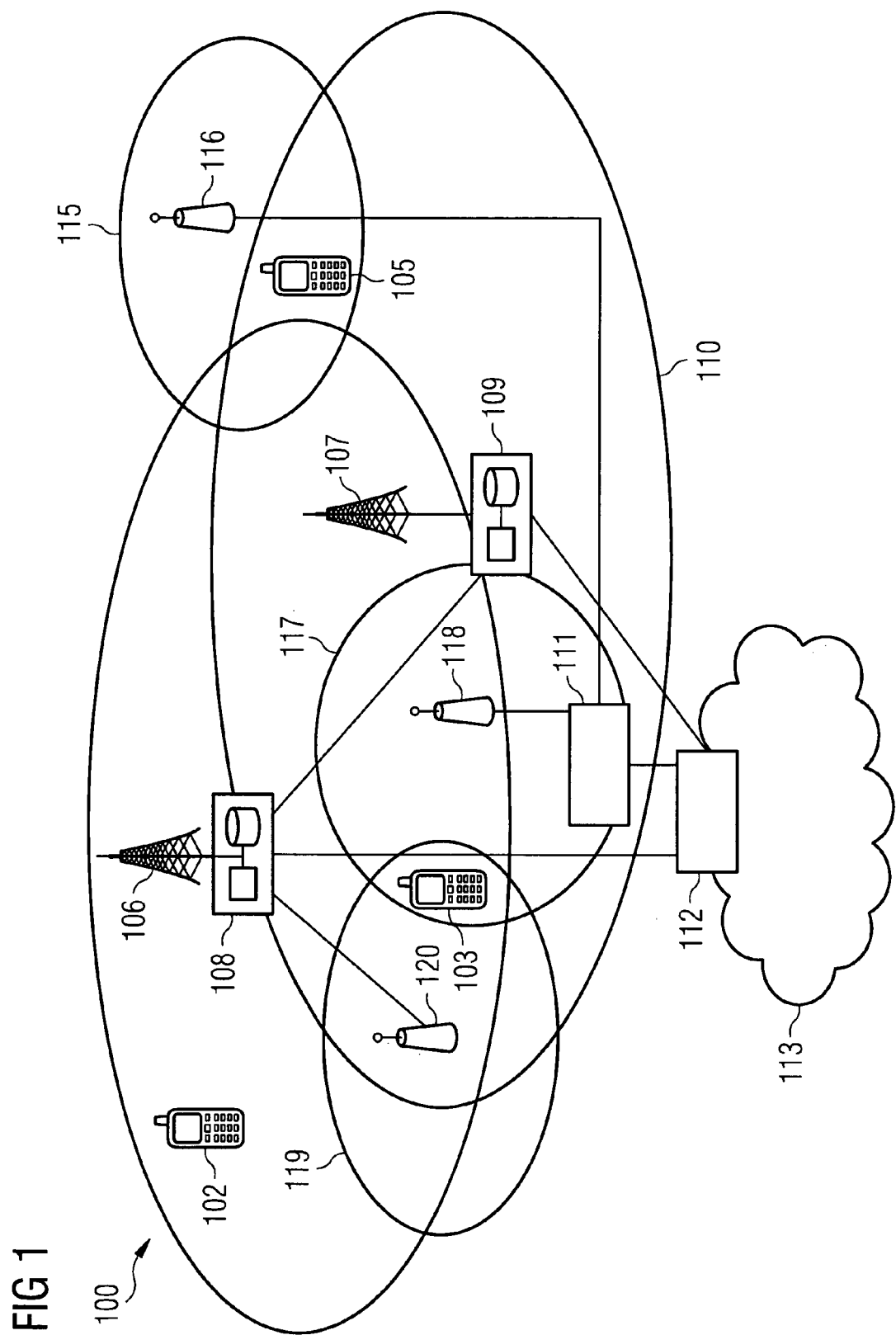
FIG. 1 shows a schematic diagram of a network according to some embodiments.

Base stations are typically controlled by at least one appropriate controller apparatus so as to enable operation thereof and management of mobile communication devices in communication with the base stations. In FIG. 1, control apparatus 108 and 109 are shown to control the respective macro level base stations 106 and 107. The control apparatus of a base station can be interconnected with other control entities. The control apparatus is typically provided with memory capacity and at least one data processor. The control apparatus and functions may be distributed between a plurality of control units. The control apparatus 108 may be part of the base station or it may be physically separate from the base station. The control apparatus 108 may serve a plurality of macro and/or pico cells. The control apparatus may for example be a radio network controller (RNC).

Long-Term Evolution (LTE) systems may however be considered to have a so-called "flat" architecture, without the provision of RNCs; rather the (e)NB is coupled to a serving gateway (S-GW) and/or mobility management entity (MME), which entities may also be pooled meaning that a plurality of these nodes may serve a plurality (set) of (e)NBs. Each UE is served by only one MME and/or S-GW at a time and the (e)NB keeps track of current association.

In FIG. 1 stations 106 and 107 are shown as connected to a wider communications network 113 via gateway 112. Gateway 112 may for example be a Gateway General Packet Radio Service Support Node (GGSN). A further gateway function may be provided to connect to another network. The smaller stations 116, 118 and 120 can also be connected to the network 113, for example by a separate gateway function and/or via the controllers of the macro level stations. In the example, stations 116 and 118 are connected via a gateway 111 whilst station 120 connects via the controller apparatus 108. Gateway 111 may for example be a Serving General Packet Radio Service Support Node (SGSN).

Figure 2:
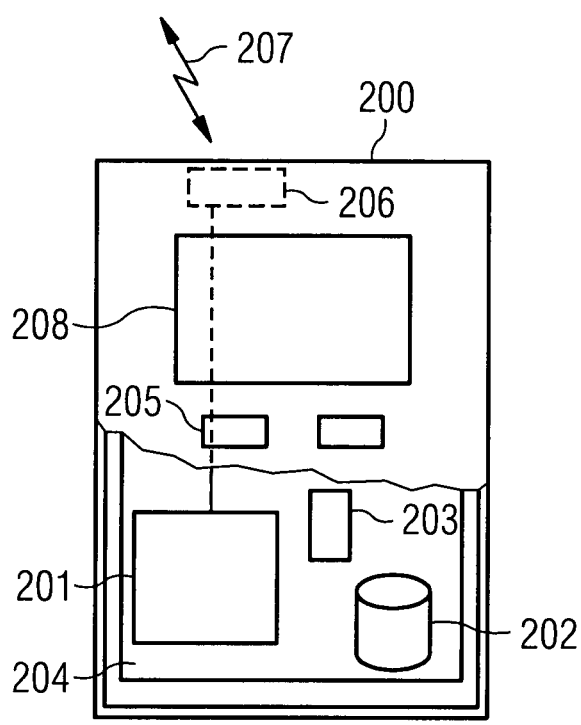
FIG. 2 shows a schematic diagram of a mobile communication device according to some embodiments.

A possible mobile communication device for transmitting and retransmitting information blocks towards the stations of the system will now be described in more detail in reference to FIG. 2 showing a schematic, partially sectioned view of a communication device 200. Such a communication device is often referred to as user equipment (UE) or terminal. An appropriate mobile communication device may be provided by any device capable of sending and receiving radio signals. Non-limiting examples include a mobile station (MS) such as a mobile phone or what is known as a 'smart phone', a computer provided with a wireless interface card or other wireless interface facility, personal data assistant (FDA) provided with wireless communication capabilities, or any combinations of these or the like. A mobile communication device may provide, for example, communication of data for carrying communications such as voice, electronic mail (email), text message, multimedia and so on. Users may thus be offered and provided numerous services via their communication devices. Non-limiting examples of these services include two-way or multi way calls, data communication or multimedia services or simply an access to a data communications network system, such as the Internet. Users may also be provided broadcast or multicast data. Non-limiting examples of the content include downloads, television and radio programs, videos, advertisements, various alerts and other information. The mobile device 200 may receive signals over an air interface 207 via appropriate apparatus for receiving and may transmit signals via appropriate apparatus for transmitting radio signals. In FIG. 2 transceiver apparatus is designated schematically by block 206. The transceiver apparatus 206 may be provided for example by means of a radio part and associated antenna arrangement. The antenna arrangement may be arranged internally or externally to the mobile device. The apparatus 102 comprises a radio frequency (RF) unit for wireless communication. The RF unit may comprise, for example, the transceiver apparatus 206 and an appropriate power amplifier (PA).

A wireless communication device can be provided with a Multiple Input/Multiple Output (MIMO) antenna system. MIMO arrangements as such are known. MIMO systems use multiple antennas at the transmitter and receiver along with advanced digital signal processing to improve link quality and capacity. Although not shown in FIGS. 1 and 2, multiple antennas can be provided, for example at base stations and mobile stations, and the transceiver apparatus 206 of FIG. 2 can provide a plurality of antenna ports. More data can be received and/or sent where there are more antenna elements. A station may comprise an array of multiple antennas. Signalling and muting patterns can be associated with Tx antenna numbers or port numbers of MIMO arrangements.

A mobile device is also typically provided with at least one data processing entity 201, at least one memory 202 and other possible components 203 for use in software and hardware aided execution of tasks it is designed to perform, including control of access to and communications with access systems and other communication devices. The data processing, storage and other relevant control apparatus can be provided on an appropriate circuit board and/or in chipsets. This feature is denoted by reference 204. The user may control the operation of the mobile device by means of a suitable user interface such as key pad 205, voice commands, touch sensitive screen or pad, combinations thereof or the like. A display 208, a speaker and a microphone can be also provided. Furthermore, a mobile communication device may comprise appropriate connectors (either wired or wireless) to other devices and/or for connecting external accessories, for example hands-free equipment, thereto.

Figure 3:
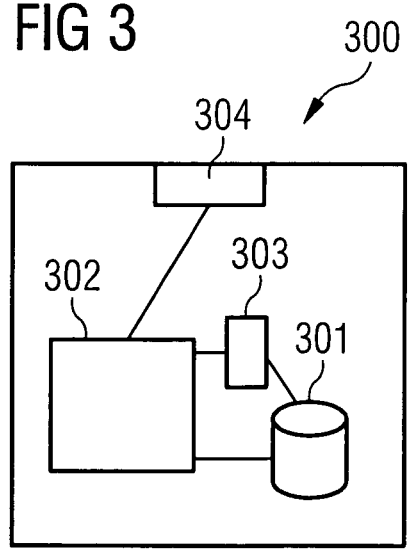
FIG. 3 shows a schematic diagram of a control apparatus according to some embodiments.

FIG. 3 shows an example of a control apparatus for a communication system, for example to be coupled to and/or for controlling a station of, an access system, such as a base station. In some embodiments base stations comprise a separate control apparatus. In other embodiments the control apparatus can be another network element. The control apparatus 300 can be arranged to provide control on communications in the service area of the system. The control apparatus 300 can be configured to provide control functions in association with generation and communication of request and instructions in view of reception of information blocks, retransmissions and other related information by means of the data processing facility in accordance with certain embodiments described below. For this purpose the control apparatus 300 comprises at least one memory 301, at least one data processing unit 302, 303 and an input/output interface 304. Via the interface the control apparatus can be coupled to a receiver and a transmitter of the base station, which may be comprised in an RF unit or radio module of the base station. A power amplifier may also be provided for powering the RF unit. The control apparatus 300 can be configured to execute an appropriate software code to provide the control functions. It shall be appreciated that similar components can be provided in a control apparatus provided elsewhere in the system for controlling reception of sufficient information for decoding of received information blocks.

The communication devices 102, 103, 105 can access the communication system based on various access techniques, such as code division multiple access (COMA), or wideband COMA (WCDMA). Other examples include time division multiple access (TDMA), frequency division multiple access (FDMA) and various schemes thereof such as the interleaved frequency division multiple access (IFDMA), single carrier frequency division multiple access (SC-FDMA) and orthogonal frequency division multiple access (OFDMA), space division multiple access (SDMA) and so on.

Typically, an RF unit or radio module of a user equipment or base station is connected to a power amplifier (PA) to provide the necessary transmission power. In order to reduce the battery/power consumption of the user equipment or base station the radio module can go in to a discontinuous transmission (DTX) state when no signals need to be transmitted. Typically the radio module is connected to a system module within the user equipment or base station which can instruct the radio module when to go in to the discontinuous transmission (DTX) state. Accordingly a signal path and signalling is required between the radio module and the system module, so that the radio module can receive the necessary signals to be instructed to go in to the DTX state, or micro-DTX (µDTX) state.

In order to support the low power mode of the PA, a counter structure and synchronization between system module and radio module is provided (timer based µDTX). Timer based LTE µDTX is only applicable for a pure LTE configuration; a mixture of LTE, GSM or even WCDMA is not supported. Switching off the PA using timer based µDTX has been implemented in some previous digital front end (DFE) devices. The PA Gate Bias in those DFE devices is switched off completely by a RF switch that controls the gate voltage. The RF switch is steered by one GPIO (general purpose input-output (IO)) per pipe. The term "pipe" here means a single transmission path of the RF unit. The RF switch is controlled on a timer based mechanism with software (SW) configurable offsets.

As the Radio Module (RM) gate bias switch requires some time to switch on a gate bias voltage, the information to switch Gate Bias on/off must be transmitted in advance by a separate message from system module (SM) to the RM. The information can be sent via a low latency channel of the interface SM-RM. In case of Open BaseStation Architecture Initiative (OBSAI) this will be 'RP3 control message' and in case of Common Public Radio Interface (CPRI) 'Vendor Specific Byte' (VSB).

The following information can be provided to the RM by the SM:
   The type of used Cyclic Prefix, either normal or extended Cyclic Prefix; number of symbols per TTI
   Information about the symbol occupancy of the next timeframe
   The timeframe could be, for example, a 4×10 ms timeframe. In other embodiments the timeframe may be varied.
   The following parameters of the timer should be configurable so that there can be fine-tuned RF unit development and adapted to different hardware (HW). They are available for each pipe of the RM:
   Configurable offset to Basestation Clock Number (BCN)
   Type of used Cyclic Prefix (CP) has to be distinguished between normal CP
   On/Off PA control data for each symbol over timeframe
   Delayed switching off of Gate Bias shall be configurable
   Advanced switching on of Gate Bias shall be configurable
   If no new On/Off PA control data configuration is available, either repeat pattern for or deactivate bias switch (Gate Bias always on). This is configurable by O&M.
   SW is used to enable or disable the timer based LTE µDTX power saving feature.

The above mentioned examples require signalling between the radio module and the system module in order for the radio module to be put in a timer-based DTX, low-power mode.

Some embodiments described further below introduce the concept of an autonomous auto-detection circuit to identify periods in which the RF unit or radio module can be placed into a DTX state. This may be achieved without signalling between RM and SM.

For example, for power saving the apparatus is enabled to control the switch-off of the PA Gate Bias during times when no data (e.g. zero TX, empty LTE symbols or GSM idle slots) have to be transmitted (signal break) in LTE (FDD/TDD) and GSM systems and to demand the switch-on of the Gate Bias when the signal break is finished and data has to be transmitted again.

In the described autonomous μDTX, the functionality of switching off and on of PA Gate Bias may be provided without received information about the occurrence of the signal breaks from the system module. Accordingly Signalling between the system module and the radio module for autonomous μTX is not required, contrary to timer based LTE μDTX.

In embodiments the RF module detects the signal break (zero TX) autonomously, on a per-pipe basis. The RF module may control every PA with a separate PA bias switch for switching PA Bias on and off via GPIOs; for example four GPIOs where there are four pipes. The PAs may also be grouped together. Where the PAs are grouped together, a common bias switch may be used.

To avoid or reduce switching spectrum, in embodiments there is no switching when RF power is transmitted. For this reason there may necessarily be some delay before switching-off the Gate Bias of the PA. On the other hand, the Bias may be switched on in advance so that the Gate Bias is up and the PA is fully operable before transmitting RF power. This switching on in advance is possible as the delay of the signal inside of the RF is currently several μs. Via configurable delays for both switching-off and switching-on, the exact point of switching time can be adjusted for different supported HW (Gate Bias switch, PA); or different internal signal delay due to different configurations.

Figure 4:
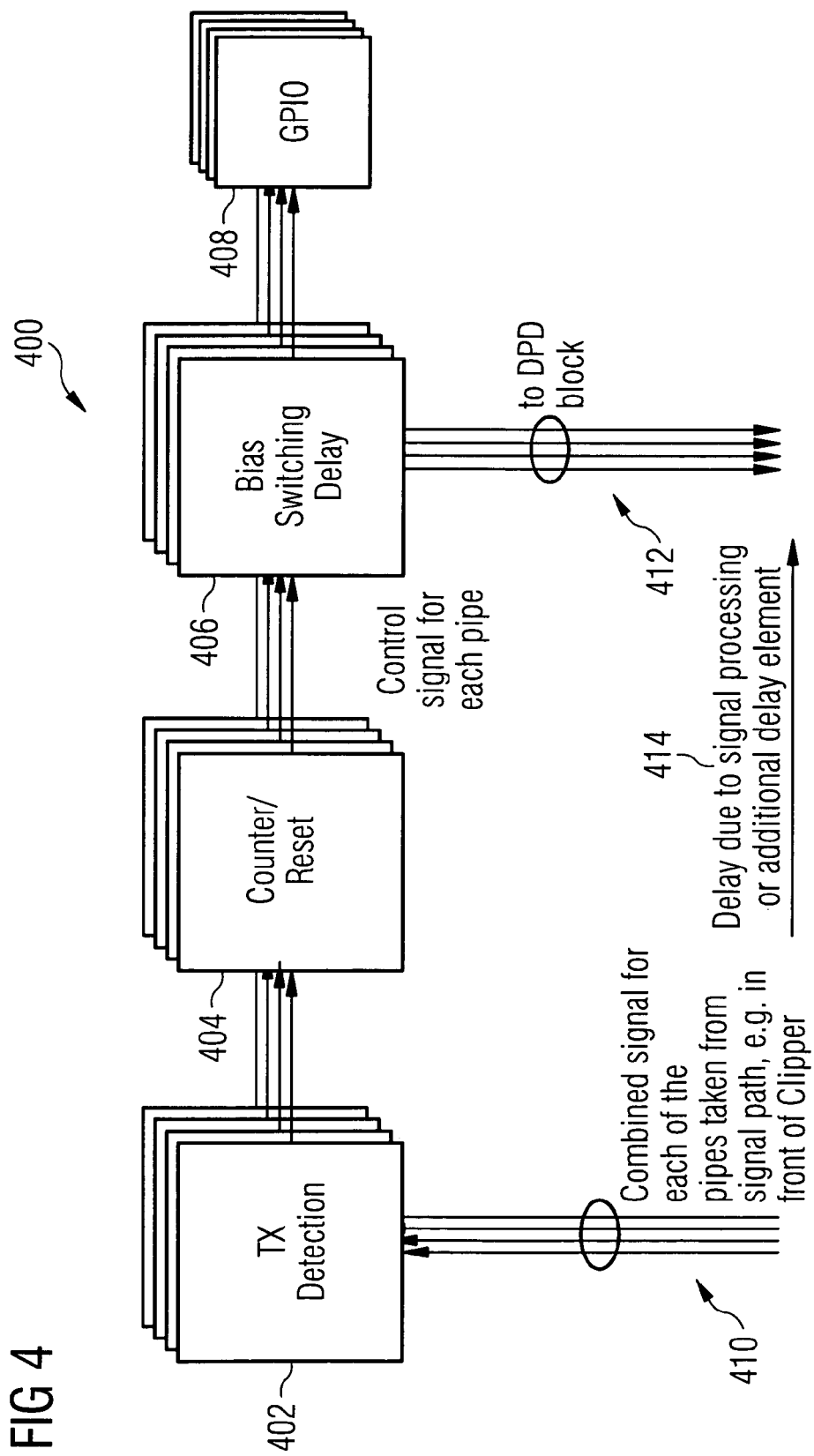
FIG. 4 is a schematic diagram illustrating some aspects according to an embodiment.

Autonomous μDTX according to some embodiments may comprise the following features:
Zero-TX detection (i.e. detection that no transmission required)
Counter/Reset
Bias Switching Delay FIG. 4 is a schematic diagram of some features of an apparatus 400 for providing autonomous μDTX according to an embodiment, supporting in this example four transmitters. It will be understood that in other embodiments fewer or more transmitters may be supported. The apparatus 400 comprises a TX detection unit 402, a counter/reset unit 404, a bias switching delay unit 406 and a GPIO 408. Four "pipes", or transmission paths 404 are shown feeding in to the TX detection unit 402. Also, four pipes 412 are shown exiting the bias switching delay unit 406. It will of course be understood that this is by way of example only and that there may be more or fewer pipes in other embodiments.

The TX detecting unit can be configured to determine when a level of transmissions (e.g. signals) has dropped below a certain threshold, or when there are zero signals to transmit. The delay between detecting a zero-signal at the TX detection unit 402 or that the signal level has dropped below the threshold level, and switching off one or more of the PAs is schematically shown by arrow 414. The delay may be caused by signal processing or an additional delay element in the signal path. The DPD (Digital Pre-Distortion) may require information that the PA (power amplifier) will be switched off and the TX data synchronized so that an optimum approximation of the (inverse) PA model can be achieved. The threshold level (which may be set at a zero-signal level) may be configurable according to requirements.

In detecting whether there is information to transmit, an IQ (in-phase, quadrature phase) data stream can be monitored. If the signal is equal to zero (or alternatively in-phase and the quadrature part of the signal is below a certain threshold, or alternatively the power of the signal is below a certain threshold), then it can be determined that there is no information to transmit.

For each of the pipes 410 that are supported by the RF module, the signal breaks are where there is no data available that has to be transmitted. For example, empty symbols in LTE and GSM idle slots may be detected. In embodiments this may be achieved by detecting zero TX power on the data stream for each pipe. In embodiments the input signals for the Zero TX detection blocks are up-converted. Then, each carrier's centre frequency is shifted to the requested one, for example different bandwidths in case of LTE (e.g. 5 MHz, 10 MHz), then carrier combining may be employed to convert the combined signal to a common intermediate frequency.

Figure 5:
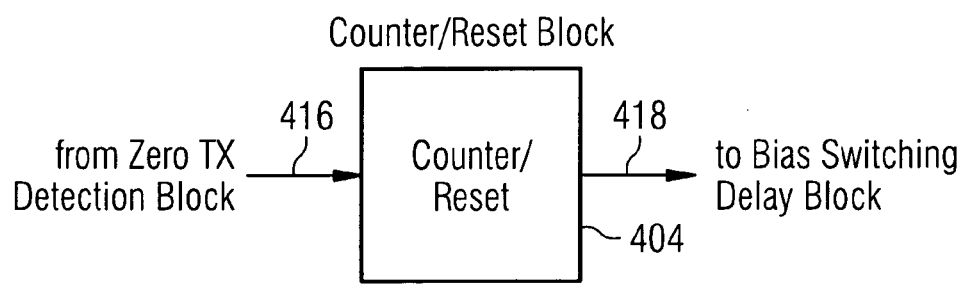
FIG. 5 is a schematic diagram of a counter/reset block, according to an embodiment.

The counter/reset block is shown in more detail in FIG. 5. FIG. 5 is simplified and shows a counter/reset block for one pipe. The counter/reset block may be able to serve more than one pipe. Alternatively there may be a separate counter/reset block for each pipe e.g. four counter/reset blocks may be provided where there are four pipes. Signals 416 are shown entering counter/reset block 404, and signals 418 are shown leaving counter/reset block 404, towards bias switching delay block 406.

A task of the Counter/Reset block 404 is to count the 'zero' samples received from TX detection block 402 of one pipe. After a configurable time, or number of counted 'zeros' a control signal (for example a continuous sending of "1") will be sent to the Bias Switching Delay block 406. In one embodiment, this configurable time is in a range of $T_g=0$ to 100 μs, with a granularity (i.e. step size) of ≤16.3 ns. It will of course be understood that the configurable time and granularity can be varied. If there is a non-zero sample on the signal of a pipe, the counter of the corresponding pipe may be reset and the control signal will also directly be reset (continuous sending of 0). In some embodiments the counter may be reset after a certain number of non-zero samples.

Figure 6:
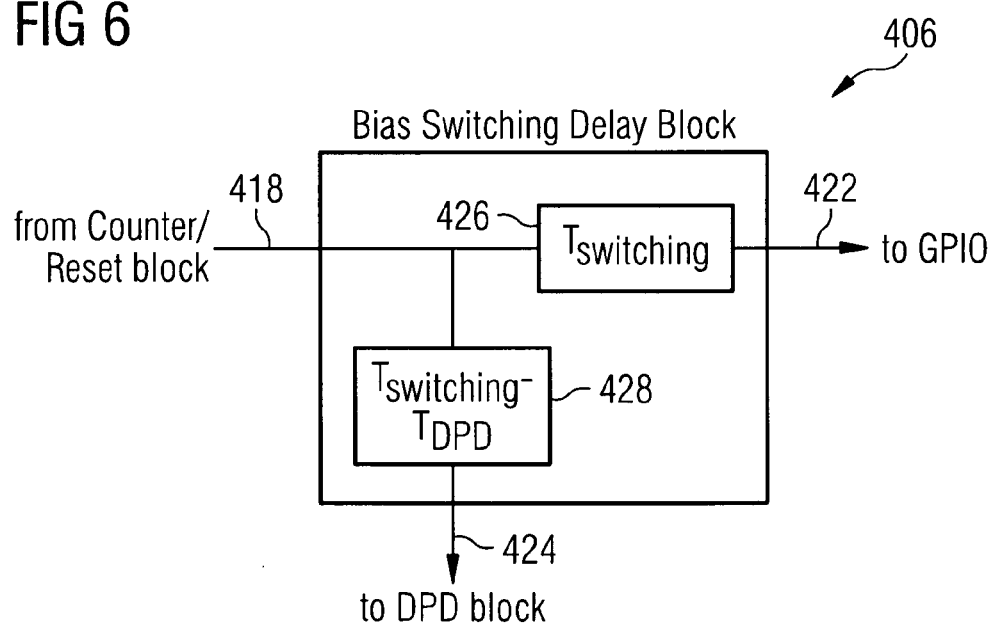
FIG. 6 is a schematic diagram of a bias switching delay block according to an embodiment.

The Bias Switching Delay block 406 is shown in more detail in FIG. 6. Incoming signals from the counter/reset block 404 are shown at 418, and outgoing signals to the GPIO 408 are shown at 422. Also, signals going to the DPD block are shown at 424. The bias switching delay block 406 comprises a $T_{switching}$ block 426 for the signals to the GPIO, and $T_{switching}-T_{DPD}$ block 428, for signals to the DPD block.

Again there may be one bias switching delay block 406 per-pipe. For example there may be four bias switching delay blocks where there are four pipes. Each Bias Switching block 406 has the task to generate a control signal for switching the PA gate bias off and on by controlling a GPIO of the RF module. Each bias switching block may be configured to delay the sending of the generated control signal. In embodiments, this delay $T_{switching}$ is configurable to have the possibility to change, together with configurable $T_g$ of the Counter/Reset block, the times for delayed switching off and advanced switching on. In embodiments, the information for switching-on and switching-off may be also provided to the DPD block. In some embodiments this happens in advance of the switching signal to GPIO 408 as the signal flow from DPD to PA takes longer than from Bias Switching Delay block 406 to GPIO 408. In embodiments, a time $T_{DPD}$ for sending in advance the switching information to DPD is also configurable.

In some embodiments, the configurable delays for the Bias switching blocks are:
$T_{switching}=0$ to 100 μs in ≤16.3 ns steps
$T_{DPD}=0$ to 100 μs in ≤16.3 ns steps It will of course be understood that, given their configurable nature, these delays and/or their granularities can be varied.

FIGS. 7a to 7c generally show the timing delays according to an example.

FIG. 7a shows transmission detection (e.g. zero-transmission detection) for a pipe, and input to the counter reset block. Initially, as shown at 700, the output signal from the TX detection unit (which is also the input to the counter/reset block) is a zero. Then, at time t1 the signal step changes to a 1. That is the TX detection unit signals that either there is no signal to transmit, or the signal amount to be transmitted is below a certain threshold level. The "1" output continues until time t2 where the signal reverts to a 0.

FIG. 7b shows the output of the counter/reset block. Initially, the output is a zero. At time t1, the output remains a zero. At time t3 (which is <t2), the signal step-changes to a 1. The output remains a 1 until time t2, where it reverts to a 0.

The delay between the signal of FIG. 7a and the signal of FIG. 7b becoming a "1" (i.e. t3 minus t1) is represented by Tg.

FIG. 7c shows the GPIO value (either off or on –0 or 1). Initially, the value is a 0 (off). Then at time t4 (t3<t4<t2), the signal step-changes to a 1 (on). The signal remains a 1 until time t5 (t5>t2), where the signal reverts to a 0. The relationship t3<t4<t2 is only true for certain values of $t_2$ and $T_{switching}$, such as in the example of FIG. 7. In some embodiments the output signal of GPIO is equivalent to the output signal of the counter/reset block, delayed by $T_{switching}$.

t4 minus t3, also referred to as $T_{switching}$, represents the delay between the output of the counter/reset block causing a corresponding change in the output of the GPIO. In this example when the GPIO output is a 1, then the PA is switched off, and the PA (and accordingly the radio module) enter the DTX mode. This may be considered a power saving mode.

From FIGS. 7a to 7c it can be appreciated that by changing of $T_{switching}$ and $T_g$ the times of:

delayed switching off of gate bias $T=T_g+T_{switching}-T_{signal}$ and advanced switching on of gate bias $T_a=T_{signal}-T_{switching}$ can be modified.

In this example $T_{signal}$ represents the Tx signal delay from a sample rate converter (SRC) to the PA. In some embodiments the SRC is part of the up-conversion chain.

In general the delays (including $T_{DPD}$) can be adapted for different use cases and resulting latencies, e.g. due to RF board and DPD changes, and can be configured for each pipe separately.

Software may be used to enable or disable the Autonomous µDTX power saving feature. The autonomous µDTX feature is applicable for at least GSM and/or LTE configurations.

Accordingly embodiments may provide power-efficient RF units by supporting a low power mode of the PA during time periods where no signal (or a signal level below a certain threshold) is to be transmitted, and without additional signalling from a system module to the RF module. That is, embodiments may generate locally the required control, inside the Digital Front End of the radio. Previously such control was generated in a separate module (System Module) and needed to be transmitted to the radio over low latency connections.

A base station, for example, may be considered to comprise:
(a) Radio Frequency (RF) block;
(b) Baseband block;
(c) Control and clock block;
(d) Transport block;

The RF block sends and receives signals to/from portable devices (via the air interface), and converts between digital data and an antenna signal. Some of the main functions are digital to analogue and analogue to digital conversion, up/down conversion, carrier selection, linear power amplification, diversity transmission and reception, RF combining and RF filtering.

The baseband block processes the baseband signal. Some functions include encoding/decoding, ciphering/deciphering, frequency hopping (GSM), spreading and rake receiver (WCDMA), MAC (WiMAX), protocol frame processing, MIMO etc.

The transport block interfaces to an external network, and provides functions such as quality of service (QoS), security functions and synchronization.

Co-ordination between these three blocks ((a), (b) and (c)) is maintained by the control and clock block.

A radio module or radio portion of an apparatus may be considered to comprise the RF block ((a)), referred to above. A system module or system portion can be in one of, or distributed across, the other blocks ((b), (c) and (d)).

The radio module and system module, or at least their functionalities, can be physically separated. In such an embodiment they may be linked with OBSAI (Open Base Station Architecture Initiative) or CPRI (Common Public Radio interface) interfaces. Alternatively, the radio module and system module could be comprised in the same physical entity, such as a chip. However, even where they are on the same chip, it will still be understood that the radio module and system module provide different functionalities, as set out above.

In some embodiments, the "low" power state is a zero power state. In some embodiments the low power state is a power state below a certain threshold. In some embodiments the "high" or "higher" power state is a power state above the zero-power state, or above the threshold. The threshold can be set so that a certain amount of information or bits can still be sent in the low power state.

In some embodiments, the power amplifier (PA) can be switched off when in the low power state. In some embodiments the power amplifier is comprised in the radio module.

Some embodiments may therefore provide:
saving low latency connections for other use;
testing the functionality at block level (instead of needing both the Radio Module and System Module up and running for testing it).

The implementation of the functionality may also be relatively simple, as the development can be carried out on a single module and doesn't need to rely on the communication of two different modules.

Although not limited as such, the described embodiments may find utility in a base station, such as a Node-B or eNode-B.

An appropriately adapted computer program code product or products may be used for implementing the embodiments, when loaded on an, appropriate data processing apparatus, for example for determining geographical boundary based operations and/or other control operations. The program code product for providing the operation may be stored on, provided and embodied by means of an appropriate carrier medium. An appropriate computer program can be embodied on a computer readable record medium. A possibility is to download the program code product via a data network. In general, the various embodiments may be implemented in hardware or special purpose circuits, software, logic or any combination thereof. Embodiments of the inventions may thus be practiced in various components such as integrated circuit modules. The design of integrated circuits is by and large a highly automated process. Complex and powerful software tools are available for converting a logic level design into a semiconductor circuit design ready to be etched and formed on a semiconductor substrate.

It is also noted herein that while the above describes exemplifying embodiments of the invention, there are several variations and modifications which may be made to the disclosed solution without departing from the scope of the present invention.

The invention claimed is:

1. A method comprising:
   detecting whether a transmitter of an apparatus has information to transmit, wherein detection whether the transmitter of the apparatus has information to transmit comprises detecting whether a level of transmission signals exceeds a specified threshold;
   in response to detection that the data in the level of transmissions has changed between exceeding and not exceeding the specified threshold, determining to change a power state of a power amplifier of said apparatus between a high power and a low power state, wherein detection of the change between exceeding and not exceeding the specified threshold and determining to change the power state are performed in a time less than or equal to the time taken to perform processing of data for transmission;
   in response to a determination to change the power state of the power amplifier, causing the power amplifier to change the power state; and
   wherein said detection is carried out within a radio portion of said apparatus.

2. A method as set forth in claim 1, wherein said detection of the change between exceeding and not exceeding the specified threshold comprises detection of a change from exceeding to not exceeding the specified threshold and wherein determining to change the power state of the power amplifier comprises causing the power amplifier to enter a low power state.

3. A method as set forth in claim 1, detection of the change between exceeding and not exceeding the specified threshold comprises detection of a change from not exceeding to exceeding the specified threshold and wherein determining to change the power state of the power amplifier comprises causing the power amplifier to enter a high power state.

4. A method as set forth in claim 1, wherein the method comprises operating a counter to monitor a time period of said detecting whether the transmitter has no information to transmit, and resetting said counter when it is detected that there is information to transmit.

5. A method as set forth in claim 1, wherein the apparatus further comprises a system portion, and wherein said detecting whether the transmitter has information to transmit and causing a power amplifier of said apparatus to change the power state in response to said detecting are carried out independently of said system portion.

6. A non-transitory computer readable medium storing a program of instructions, execution of which by at least one processor configures an apparatus to perform at least the following:
   detecting whether a transmitter of an apparatus has information to transmit, wherein detection whether the transmitter of the apparatus has information to transmit comprises detecting whether a level of transmission signals exceeds a specified threshold;
   in response to detection that the data in the level of transmissions has changed between exceeding and not exceeding the specified threshold, determining to change a power state of a power amplifier of said apparatus between a high power and a low power state, wherein detection of the change between exceeding and not exceeding the specified threshold and determining to change the power state are performed in a time less than or equal to the time taken to perform processing of data for transmission;
   in response to a determination to change the power state of the power amplifier, causing the power amplifier to change the power state; and
   wherein said determining is carried out within a radio portion of said apparatus.

7. An apparatus comprising
   at least one processor;
   and at least one memory including computer program code;
   the at least one memory and the computer program code configured to, with the at least one processor, cause the apparatus at least to:
   determine whether a transmitter of said apparatus has information to transmit, wherein detection whether the transmitter of the apparatus has information to transmit comprises detecting whether a level of transmission signals exceeds a specified threshold;
   in response to detection that the data in the level of transmissions has changed between exceeding and not exceeding the specified threshold, determining to change a power state of a power amplifier of said apparatus between a high power and a low power state, wherein detection of the change between exceeding and not exceeding the specified threshold and determining to change the power state are performed in a time less than or equal to the time taken to perform processing of data for transmission;
   in response to a determination to change the power state of the power amplifier, causing the power amplifier to change the power state; and
   wherein said detection is carried out within a radio portion of said apparatus.

8. An apparatus as set forth in claim 7, wherein said detecting whether the transmitter has information to transmit comprises determining that said transmitter has no information to transmit.

9. An apparatus as set forth in claim 7, wherein the apparatus is configured to cause said power amplifier to enter a low power state.

10. An apparatus as set forth in claim 7, wherein the apparatus comprises a counter, and the apparatus is configured to operate the counter to monitor a time period of said detecting whether the transmitter has information to transmit.

11. An apparatus as set forth in claim 7, wherein the apparatus further comprises a system portion.

12. A method as set forth in claim 1, wherein said determining whether the transmitter has information to transmit comprises detecting a transmit power of the transmitter.

13. A method as set forth in claim 1, wherein the method comprises operating a counter to monitor a time period of said detecting whether the transmitter has information to transmit.

14. A method as set forth in claim 13, comprising resetting said counter when it is determined that there is information to transmit.

15. A method as set forth in claim 1, comprising configuring a delay between said detecting whether the transmitter has information to transmit and said causing the power amplifier change the power state.

16. A method as set forth in claim 1, wherein a digital pre-distortion unit of said apparatus receives delayed bias switching information regarding the state of the power amplifier, to optimize operation of the power amplifier.

17. A method as set forth in claim 1, wherein said apparatus is comprised in one of: a base station; a network node; a user equipment.

18. A non-transitory computer readable medium as set forth in claim 6, wherein execution of the program of instructions further configures the apparatus to configure a delay between said detecting whether the transmitter has information to transmit and said causing the power amplifier change the power state.

19. An apparatus as set forth in claim 7, wherein the apparatus is further caused to configure a delay between said detecting whether the transmitter has information to transmit and said causing the power amplifier change the power state.

\* \* \* \* \*